(12) United States Patent
Zimmer et al.

(10) Patent No.: US 6,448,184 B1
(45) Date of Patent: Sep. 10, 2002

(54) FORMATION OF DIAMOND PARTICLE INTERCONNECTS

(75) Inventors: Jerry W. Zimmer, Saratoga, CA (US); Daniel A. Worsham, San Jose, CA (US)

(73) Assignees: Pacific Western Systems, Mountain View, CA (US); SP³, Mountain View, CA (US)

( * ) Notice: Subject to any disclaimer, the term of this patent is extended or adjusted under 35 U.S.C. 154(b) by 0 days.

(21) Appl. No.: 09/187,363

(22) Filed: Nov. 6, 1998

Related U.S. Application Data

(63) Continuation-in-part of application No. 09/104,881, filed on Jun. 25, 1998.

(51) Int. Cl.⁷ .............................................. H01L 21/302
(52) U.S. Cl. .................... 438/706; 438/694; 438/710; 438/720; 438/735; 438/736; 438/964
(58) Field of Search ................................ 438/597, 658, 438/665, 689, 694, 704, 706, 710, 720, 735, 736, 964; 29/846, 847, 874, 885; 228/116; 324/757

(56) References Cited

U.S. PATENT DOCUMENTS

| | | | |
|---|---|---|---|
| 4,915,779 A | * 4/1990 | Srodes et al. ............... | 438/717 |
| 5,083,697 A | 1/1992 | Difrancesco ................ | 228/116 |
| 5,086,014 A | 2/1992 | Miyata et al. ............... | 437/103 |
| 5,112,649 A | * 5/1992 | Bringmann et al. ...... | 427/249.17 |
| 5,183,530 A | * 2/1993 | Yamazaki .................... | 156/345 |
| H1249 H | * 11/1993 | Machonkin et al. .......... | 438/21 |
| 5,562,801 A | * 10/1996 | Nulty .......................... | 156/345 |
| 5,803,967 A | 9/1998 | Plano et al. ................ | 117/102 |
| 5,834,335 A | * 11/1998 | Buschbom ................... | 438/107 |
| 5,844,252 A | * 12/1998 | Shiomi et al. ................ | 257/10 |

OTHER PUBLICATIONS

Exatron Data Sheet, entitled "Particle Interconnect".

* cited by examiner

*Primary Examiner*—Benjamin L. Utech
*Assistant Examiner*—Lan Vinh
(74) *Attorney, Agent, or Firm*—Thomas Schneck; Gina McCarthy

(57) ABSTRACT

Rough, conductive diamond film regions are formed on a substrate for establishing electrical contact with a surface mount semiconductor package, or the like. The substrate base is heated in a diamond film gas phase deposition reactor. Molecular hydrogen, a carbon-bearing gas and a dopant source are introduced into the reactor at a temperature conducive to producing a conductive polycrystalline diamond film with sharp facets extending from the film. The diamond film is patterned by etching to remove regions where no electrical contact with the surface mount package is desired.

13 Claims, 3 Drawing Sheets

FORMATION OF DIAMOND PARTICLE INTERCONNECTS

CROSS REFERENCE TO RELATED APPLICATION

This application is a continuation-in-part of application Ser. No. 09/104,881 filed Jun. 25, 1998.

TECHNICAL FIELD

The invention relates to formation of electrical contacts between an electron device and a substrate and, more particularly, to in-situ formation of conductive diamond film regions for crystalline particle interconnects with an electron device.

BACKGROUND ART

Particle interconnects are conductive particles embedded in conductive traces on an insulative or semiconductive substrate for scratching the surface of an electron device, usually a semiconductor chip, for the purpose of making electrical contact upon mechanical compression of the chip and substrate. Diamond particles screened to sizes between 10 and 125 microns are electrically plated onto a substrate in patterns defined by standard photoresist processes used in the semiconductor industry. The patterns are designed to match leads or pins or contacts of semiconductor chips. Upon pressing a chip onto a substrate having diamond particles embedded in patterns of corresponding traces, electrical contact is made along the traces through the leads, pins or contacts of the chip.

In another approach, diamond particles are sifted down to 100 grit material which is trapped in a screen having pores of similar dimensions. The screen is placed on a metalized surface, rolled onto the surface, then plated over to keep the diamond particles in place.

U.S. Pat. No. 5,083,697 to Difrancesco teaches a method of joining two metal surfaces using metallized particles having a hardness greater than the metals to be joined. The patent teaches that high local stress causes elastoplastic deformation which promotes formation of diffusion bonds between the materials.

Exatron Corporation of San Jose, Calif. has devised a micro-miniature bed-of-nails formed by diamond particles in an electroplate matrix on a substrate. The particles make electrical connection between contacts of a chip and the substrate by penetrating the oxides on the contacts by scratching through surface oxide layers. The particles are small enough so that the contacts are not damaged, but large enough so that a low resistance path is established. The prior art approach is shown in FIG. 1. A support 11 carries an insulative layer 13, such as a ceramic, polyimide or Kapton layer which is only a few thousandths of an inch thick. A thin conductive layer 15, thinner than insulative layer 13, is electroplated onto the insulative layer. The conductive layer is a matrix, such as nickel, for holding small diamond particles 17, some of which are shown protruding from the conductive layer 15. An electrical lead 19 is shown to have an oxide coating 21. This oxide coating is penetrated or scratched by diamond particles 17 when lead 19 is pushed down onto conductive layer 15, thereby establishing electrical contact between lead 19 and conductive layer 15.

A typical dimension for the width or thickness of electrical lead 19 with oxide coating 21 is indicated by the letter "A" and is about 0.010 inches. The height of diamond particles 17 above conductive layer 15 is indicated by the letter "B" and is about 0.001 inches. The combined height of diamond particles 17, conductive layer 15 and insulative layer 13 is indicated by the letter "C" and is about 0.004 inches.

While particle interconnect technology looks promising, the formation of diamond particle electroplate slurries is difficult because of non-uniformities in the mixture. Diamond particles tend to clump together due to electrostatic forces and mixing difficulties. If the electroplate slurry is not uniform the deposited diamond film will be non-uniform. An object of the invention has been to devise a method of forming uniform diamond particle conductive traces for electrical interconnects.

SUMMARY OF INVENTION

The above object has been achieved by in-situ formation of a conductive polycrystalline diamond layer on a substrate. The layer has sharp crystalline diamond facets projecting therefrom and is formed so that portions of the layer are in appropriate places for making electrical contact with a semiconductor device which will be brought into pressure contact with the layer. Rather than providing a slurry of electroplate material with diamond particles mixed therein, the present invention provides a single conductive diamond film layer, with portions of the film having sharp diamond crystal facets extending from the film.

In one embodiment, a substrate or base capable of withstanding 800° C. without deformation is placed in a heated diamond film gas phase deposition reactor. Such reactors have been known for a long time and are commercially available. A diamond film is formed over the whole surface of the substrate by introducing molecular hydrogen, a carbon bearing gas, such as an alkane, to be cracked within the reactor to form molecular carbon and a dopant source, all at a temperature conducive to the deposition of a polycrystalline diamond layer on the substrate base. The polycrystalline diamond layer, having exposed sharp facets, is etched down to the substrate base to define a desired pattern of contact zones and traces of polycrystalline diamond particles for use as interconnects. The dopant source provides sufficient conductivity so that the diamond particles themselves and the film may form conductive traces for electrical contact with a device, particularly where the substrate does not have previously formed metal traces.

The described in-situ formation method has no matrix which holds the diamond particles. Rather, the diamond particles are in a continuous diamond film with crystalline facets projecting from the film. This is a distinct change relative to the prior art which has taken the approach of embedding diamond particles in various matrices for different applications. A diamond film has the distinct advantage of uniformity because mixing of particles within the matrix is not necessary. Diamond crystal facets appear randomly, but with sufficient density that good electrical contact is assured.

In another embodiment, a substrate is roughened by abrading with diamond grit to remove oxides or other films. The substrate is placed in a diamond film reactor as above. A diamond film is formed in-situ on the substrate by introducing molecular hydrogen, a carbon bearing gas to be cracked within the reactor to form molecular carbon and a dopant source, all at a temperature conducive to the deposition of a polycrystalline diamond layer on the substrate base. The diamond layer is etched where no contacts are wanted, leaving polycrystalline diamond film on the contact regions.

BEST MODE OF CARRYING OUT THE INVENTION

Figure 1:
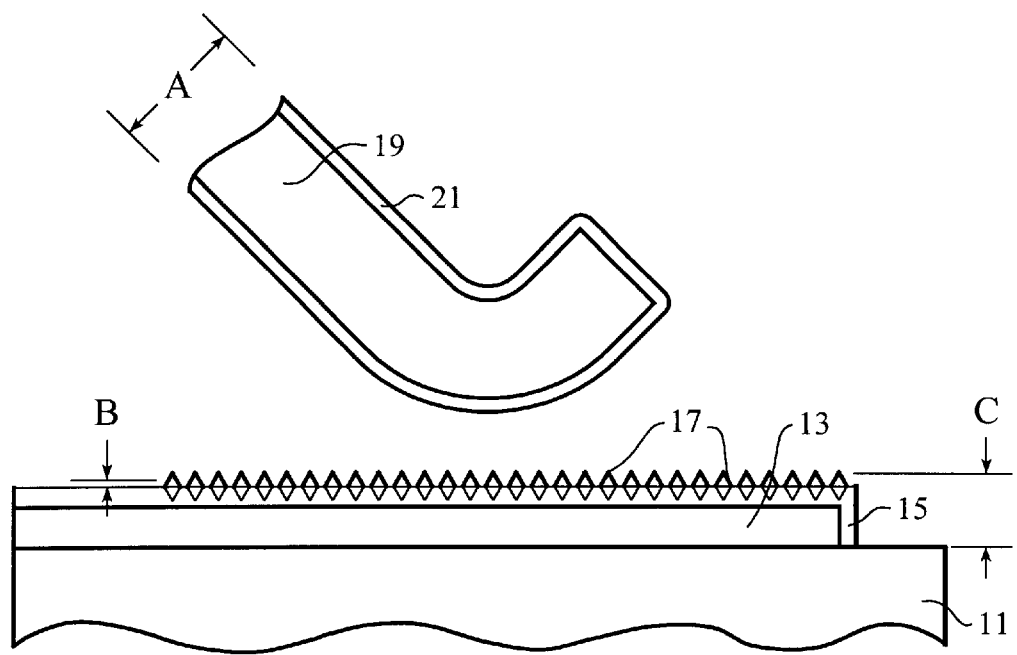
FIG. 1 is a side plan view of a prior art diamond particle interconnect between an electrical lead and an electroplated matrix on a substrate.
Figure 2A:
FIGS. 2A, 2B, 2C, 2D, 2E, 2F and 2G are side plan views of a method of making diamond particle interconnects in accord with the present invention.

With reference to FIG. 2A, a thin substrate 25 is placed on a support surface. The substrate 25 is an insulating material such as ceramic, silicon, silicon carbide, or other material which will withstand temperatures up to 1000° C. without deformation. The substrate may have conductive metal traces thereon, not shown, terminating in contact zones where conductive diamond film islands are to be formed. Alternatively, the conductive traces can be formed by the conductive diamond film islands described below.

Figure 2B:
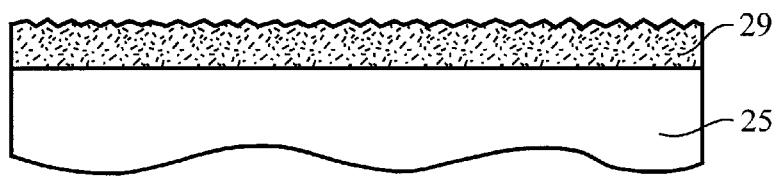

Next the substrate is placed in a hot filament reactor at a temperature of approximately 700 to 1000° C. The reactor is open to gas flow of a carbon bearing gas, such as methane, in the presence of hydrogen. A dopant source containing boron, such as diborane, $B_2H_6$, is also present in the reactor. This causes the formation of a conductive polycrystalline diamond film coating 29, seen in FIG. 2B. Some of the hydrogen gas is dissociated into atomic hydrogen and etches any graphite deposited on the substrate without attacking the diamond, causing the deposition of carbon which self-organizes into diamond crystals. The reactor conditions may be adjusted so that the principal deposition of the diamond film is in the form of pyramids having a 1-1-0 or 1-1-1 crystal orientation, with a density of at least 2000 facets per square millimeter. Different reactors may form the deposition at different temperatures, depending on the type of the reactor. A preferred reactor is a tungsten wire array reactor, long known in the diamond film industry.

Figure 2C:
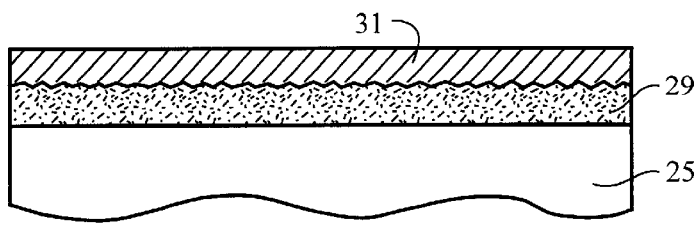

Once the thin diamond film layer 29 has been deposited over substantially the entirety of the substrate, a hard masking layer 31 is applied over the entirety of the surface, as seen in FIG. 2C. The hard mask layer is preferably aluminum which is vapor deposited or sputtered onto the diamond film layer 29 to a thickness of approximately one micron. The surface of the aluminum layer will oxidize to form aluminum oxide. On the other hand, materials may be used for the hard mask layer 31 such as chrome, polysilicon or silicon nitride. Metals are usually sputtered or vapor deposited onto the diamond film layer, while silicon materials are vapor deposited.

Figure 2D:
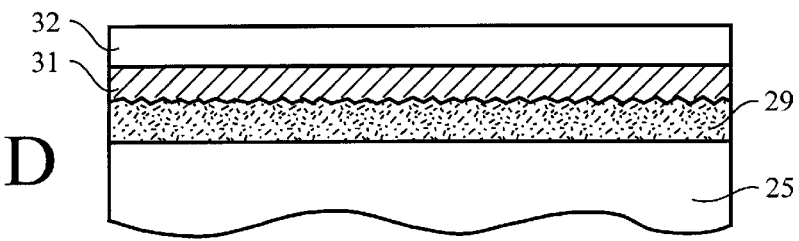
Figure 2E:
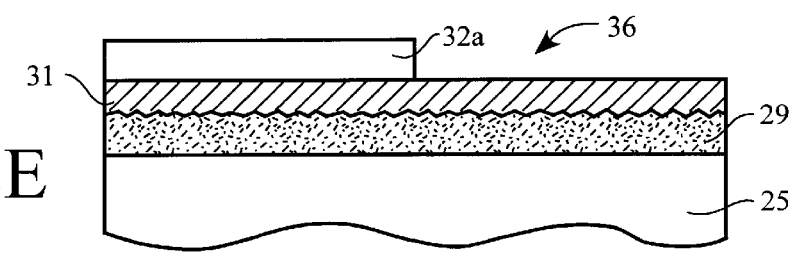
Figure 2F:
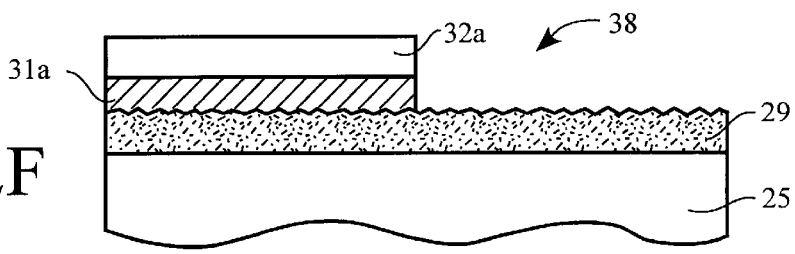

Next, a layer of photoresist 32 is applied over the entirety of the surface to a thickness of a few microns, as seen in FIG. 2D. Next, the photoresist is patterned so that contact areas of the diamond film will be defined. Contact areas are those areas where conductive diamond contact with a chip or device is desired. Patterning of the photoresist, followed by removal of unwanted portion, leaves islands of photoresist 32a, as seen in FIG. 2E, protecting the desired diamond contact zones, but exposing portions of the hard mask layer 31, such as region 36. Next, the exposed aluminum region 36 is etched with a base, such as KOH which attacks the aluminum, but does not affect the photoresist island 32a, or diamond film regions. The resulting structure is seen in FIG. 2F where aluminum islands 31a remain under photoresist regions 32a, with exposed diamond film regions 38.

Figure 2G:
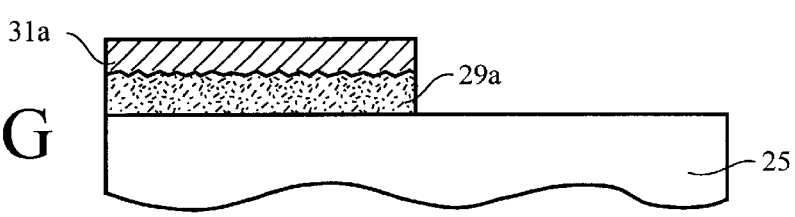
Figure 3:
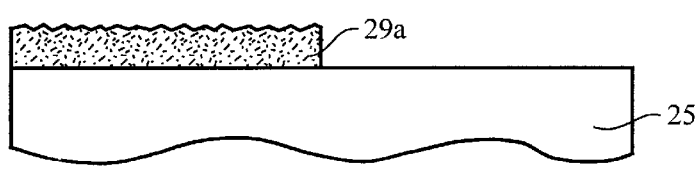
FIG. 3 is a side plan view of a diamond particle interconnect region in accord with the present invention.

Next, a reactive ion etch (RIE) using oxygen is used to remove the exposed diamond film regions 38, as well as the remaining photoresist, as seen in FIG. 2G. A hard mask island 31a protects a diamond film island 29a, but other diamond film regions have been removed. Lastly, remaining islands of the hard mask are removed with KOH, as seen in FIG. 3, leaving only islands 29a of the diamond film. These remaining islands are contact regions for electronic devices so that electrical communication may be established with the devices through the conductive diamond film islands and associated conductive traces. The traces may be diamond film made in the same way and at the same time as the islands described above.

As a modification of the above process, the substrate 25 may be abraded by buffing or polishing, perhaps ultrasonically, with diamond paste which scratches the surface of the substrate and leaves tiny diamond particles which act as seeds over the entire surface of the substrate for the formation of the diamond film layer.

Figure 4:
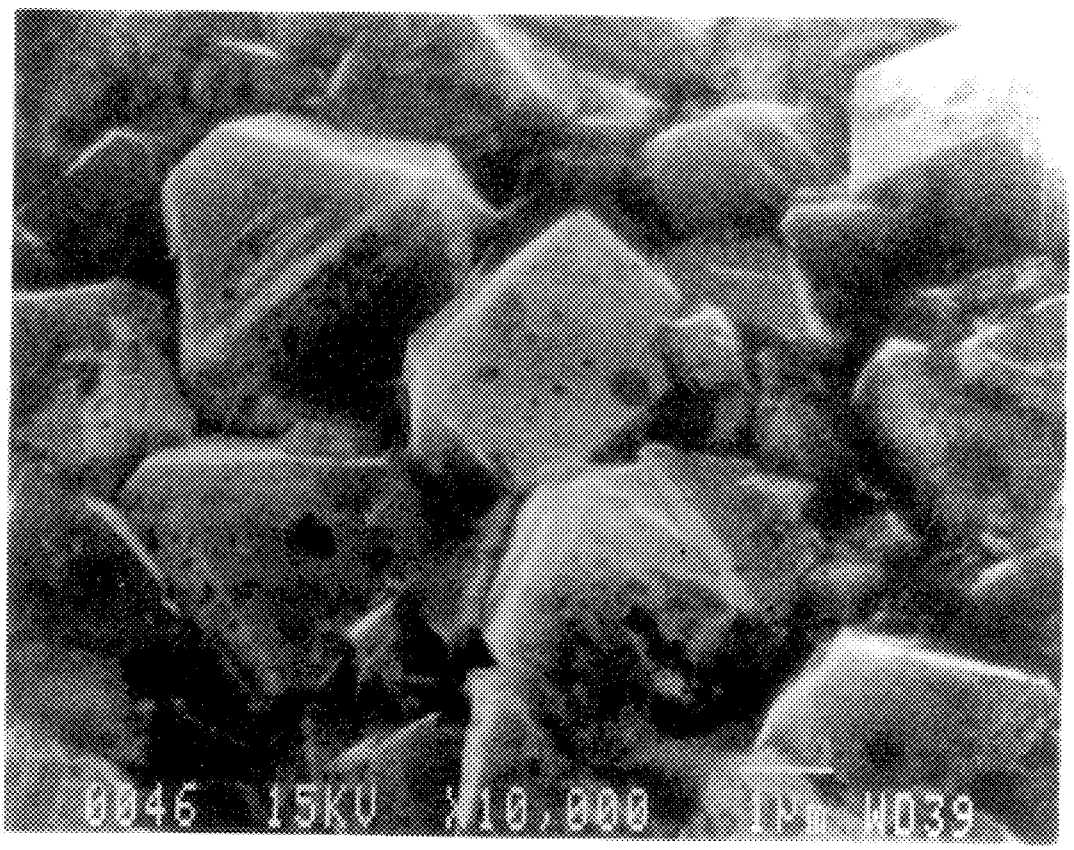
FIG. 4 is a photomicrograph of a diamond particle layer for forming interconnects in accord with the present invention.

The microphotograph of FIG. 4 shows the facets with a density described above, i.e. greater than 2000 per square millimeter. This will provide sufficient abrasion to an oxide or nitride surface to allow surface contact to a chip lead, without wearing away the lead. Since diamond does not oxidize, no preparation of new surfaces, such as cleaning, is necessary. The microphotograph shows the general regularity of facets, which have a grain size of between 5 and 100 square microns. The conductive diamond region is usually formed atop a conductive trace or an insulative substrate so that electricity, usually low voltage signals, is conducted through the trace and through the diamond region into and out of an electron device, particularly a surface mount device, having a terminal in intimate pressure contact with the conductive diamond region.

We claim:

1. A method of making conductive regions on a substrate for receiving contacts of surface mounted semiconductor packages or devices comprising, providing a substrate base capable of withstanding temperatures exceeding those found in a diamond film gas phase deposition reactor without deformation of the substrate base, placing the substrate base in a heated diamond film gas phase deposition reactor, introducing molecular hydrogen, a carbon bearing gas, and a dopant source into the reactor at a temperature conducive to the deposition of a conductive polycrystalline diamond layer on the substrate base, and etching the polycrystalline diamond layer down to the substrate base in some regions and not other regions such that polycrystalline diamond layer regions that have not been etched correspond to contacts of surface mounted semiconductor packages or devices and are able to directly receive said contacts by pressure contact.

2. The method of claim 1 further defined by adjusting heating of the gas reactor to a temperature wherein the conductive polycrystalline diamond layer is deposited on the base with exposed pyramidal apexes having a density of at least 2000 per square millimeter.

3. The method of claim 1 wherein said polycrystalline diamond layer regions that have not been etched are in electrical contact with conductive traces on the substrate connecting the contact regions to electrical circuits.

4. A method of making conductive regions on a substrate for receiving contacts of surface mounted semiconductor packages or devices comprising, depositing conductive traces on a substrate prior to forming a polycrystalline diamond layer, forming said polycrystalline diamond layer on said substrate, depositing a hard mask over the diamond layer, patterning a layer of resist over the hard mask, forming protected and unprotected regions of the underlying hard mask, etching the hard mask in the unprotected regions, etching the diamond film layer in unprotected regions and removing remaining resist, and etching remaining regions of the hard mask, thereby leaving diamond film islands corresponding to the protected hard mask regions and contacts of surface mounted semiconductor packages or devices such that said film islands are able to directly receive said contacts by pressure contact.

5. The method of claim 4 wherein the diamond film island have exposed pyramidal apexes having a density of at least 2000 per square millimeter.

6. The method of claim 4 wherein the hard mask is a non-oxidizing material.

7. The method of claim 4 wherein the hard mask is an aluminum layer.

8. The method of claim 4 wherein the polycrystalline diamond layer is formed by introducing molecular hydrogen, a carbon bearing gas and a dopant source into a gas phase deposition reactor having said substrate in an exposed position.

9. The method of claim 8 wherein the carbon bearing gas is an alkane.

10. The method of claim 8 wherein the carbon bearing gas is an alkane and the dopant source contains boron.

11. A method of making conductive regions on a substrate for receiving contacts of surface mounted semiconductor packages or devices comprising, on a substrate, forming conductive traces terminating in contact zones, after forming conductive traces, forming a polycrystalline diamond layer on the substrate, covering said traces, depositing a hard mask over the diamond layer, patterning a layer of resist over the hard mask, forming protected and unprotected regions of the underlying hard mask, the protected regions being over the contact zones, etching the hard mask in the unprotected regions, etching the diamond film layer in unprotected regions and removing remaining resist, and etching the remaining regions of the hard mask, thereby leaving diamond film islands corresponding to the protected hard mask regions over the contact zones and contacts of surface mounted semiconductor packages or devices such that said film islands are able to directly receive said contacts by pressure contact.

12. A method of making conductive regions on a substrate for receiving contacts of surface mounted semiconductor packages or devices comprising, forming a polycrystalline diamond layer on a substrate, depositing a hard mask over the diamond layer, patterning a layer of resist over the hard mask, forming protected and unprotected regions of the underlying hard mask, etching the hard mask in the unprotected regions, etching the diamond film layer down to the substrate base in unprotected regions and removing remaining resist, and etching remaining regions of the hard mask, thereby leaving diamond film islands corresponding to the protected hard mask regions and terminals of surface mounted semiconductor packages or devices such that said diamond film islands are able to directly receive said terminals by pressure contact.

13. A method of making conductive regions on a substrate for receiving contacts of surface mounted semiconductor packages or devices comprising, forming a polycrystalline diamond layer on a substrate, depositing a hard mask over the diamond layer, patterning a layer of resist over the hard mask, forming protected and unprotected regions of the underlying hard mask, etching the hard mask in the unprotected regions, etching the diamond film layer down to the substrate base in unprotected regions and removing remaining resist, and etching remaining regions of the hard mask, thereby leaving diamond film conductive traces corresponding to the protected hard mask regions and contacts of said surface mounted semiconductor packages or devices such that said conductive traces are able to directly receive said contacts by pressure contact.

\* \* \* \* \*